(12) United States Patent
Moriyama

(10) Patent No.: US 7,964,421 B2
(45) Date of Patent: Jun. 21, 2011

(54) PROCESS FOR PRODUCING ORGANICLIGHT-EMITTING DISPLAY DEVICE

(75) Inventor: Takashi Moriyama, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 142 days.

(21) Appl. No.: 12/301,340

(22) PCT Filed: Aug. 20, 2007

(86) PCT No.: PCT/JP2007/066503
§ 371 (c)(1),
(2), (4) Date: Nov. 18, 2008

(87) PCT Pub. No.: WO2008/026524
PCT Pub. Date: Mar. 6, 2008

(65) Prior Publication Data
US 2009/0124033 A1    May 14, 2009

(30) Foreign Application Priority Data
Aug. 29, 2006  (JP) .................................. 2006-231472

(51) Int. Cl.
*H01L 21/00* (2006.01)

(52) U.S. Cl. ............... 438/29; 438/22; 438/48; 438/700; 438/723; 438/738

(58) Field of Classification Search ......................... None
See application file for complete search history.

(56) References Cited

U.S. PATENT DOCUMENTS
2005/0130356 A1* 6/2005 Yotsuya ......................... 438/172
2005/0153472 A1* 7/2005 Yotsuya ........................... 438/29

FOREIGN PATENT DOCUMENTS
| JP | 2004-169061 | 6/2004 |
| JP | 2005-158571 | 6/2005 |
| JP | 2005-206939 | 8/2005 |
| JP | 2005-248249 | 9/2005 |

(Continued)

OTHER PUBLICATIONS

Machine Translation of JP 2005-248249, Sep. 15, 2005.

(Continued)

*Primary Examiner* — N Drew Richards
*Assistant Examiner* — Kyoung Lee
(74) *Attorney, Agent, or Firm* — Fitzpatrick, Cella, Harper & Scinto

(57) ABSTRACT

A position displacement between a substrate and a mask which is caused when the substrate and the mask are brought into close contact with each other is suppressed by a magnetic force. In a step of forming an organic compound layer (organic EL element film) included in an organic light-emitting display device on the substrate (2) through the mask (3) by vapor deposition, the substrate (2) is aligned with the mask (3) and then the substrate (2) is pressed to the mask (3) by a plurality of pressing members (5) to perform temporary fixation. While the position displacement between the substrate (2) and the mask (3) is suppressed by the temporary fixation, the substrate (2) is brought into close contact with the mask (3) by magnets (6). A plurality of positions of the substrate (2) which has aligned are temporarily fixed by the plurality of pressing members (5), respectively, so that high-precision patterning can be performed to prevent a deviation of the organic EL element film from an anode.

3 Claims, 7 Drawing Sheets

FOREIGN PATENT DOCUMENTS

| | | |
|---|---|---|
| JP | 2005-251498 | 9/2005 |
| JP | 2005-256101 | 9/2005 |
| KR | 10-2005-0051551 | 6/2005 |
| KR | 10-2005-0067084 | 6/2005 |

OTHER PUBLICATIONS

Partial Translation of JP 2005-248249, Sep. 15, 2005.

Korean Office Action issued in the counterpart application No. 10-2009-7006078 dated Oct. 26, 2010—3 pages.

* cited by examiner

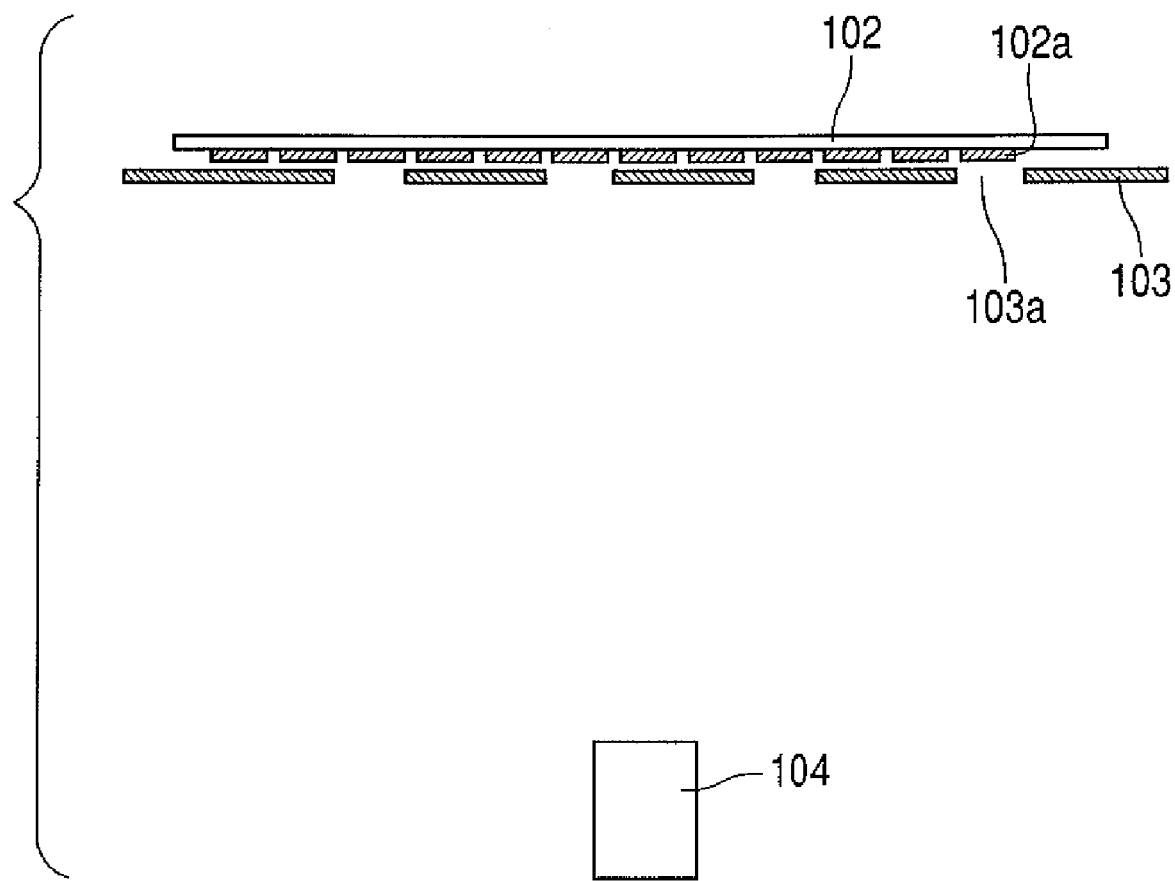

PROCESS FOR PRODUCING ORGANIC LIGHT-EMITTING DISPLAY DEVICE

TECHNICAL FIELD

The present invention relates to a process for producing an organic light-emitting display device such as an organic electroluminescence display device (organic EL display device) having high definition and a large size, which is used for a display or the like.

BACKGROUND ART

In recent years, attention is being given to a flat panel display that uses an organic light-emitting element. In particular, a display that uses an organic electroluminescence element (organic EL element) has an advantage that low voltage driving can be performed and high-speed response and a wide view angle are obtained, and therefore device application research including material development has been conducted energetically.

The organic EL element is a carrier injection type surface light-emitting device utilizing an emitted light generated at the time of combining an electron and a hole which reach the light-emitting layer. Various emitted light colors are obtained by the selection of organic materials.

In an organic EL display, when three primary colors of red, green and blue (R, G and B) are used as colors of emitted light from respective pixels, full color display is achieved. Currently, in a process for producing an organic EL display panel, peripheral techniques for realizing full color display are under development.

In view of the device characteristics of the current organic EL elements, a vacuum vapor deposition using low-molecular EL materials is practically employed. In particular, in order to realize full color display, a process for selectively patterning respective light emission pixels of R, G and B by vapor deposition using a mask (vapor deposition mask) is employed.

FIG. 8 illustrates a patterning vapor deposition step for the organic EL display by vacuum vapor deposition. A substrate 102 placed in a vacuum chamber (vacuum vapor deposition chamber) includes pixel electrodes 102a formed by patterning in advance. Pixel electrodes on the substrate 102 are aligned with opening portions 103a of a mask 103. A material is vapor-deposited from a vapor deposition source 104 with a state in which the substrate 102 is in close contact with the mask 103, so that an organic thin film (organic compound layer) having a shape corresponding to an opening pattern of the mask 103 is formed on the substrate 102.

When a material for obtaining each emitted light color is to be evaporated for each of R, G, and B color pixels, a mask is exchanged with another mask according to a vapor deposition material. Alternatively a single mask is relatively shifted in position, thereby realizing separate deposition.

When the mask is thickened, a shadow effect becomes larger, so that there is the case where it is difficult to obtain a film formation pattern having a desirable size. In order to obtain a film formation state in which the thickness and the size are desirable for each pixel, it is effective to thin the mask. When a space between the mask and the substrate becomes excessively large, it is likely to cause insertion of the vapor deposition film into the space. When the insertion is significant, there is the case where a fault such as mixture of emitted light colors which is caused by inserting a material for emitting light of a color into another material for emitting light of a different color in an adjacent pixel.

Therefore, as disclosed in Japanese Patent Application Laid-Open No. 2005-158571, after the substrate is aligned with the mask, it is necessary to dynamically press the substrate to bring the mask and the substrate into close contact with each other.

However, in the method disclosed by Japanese Patent Application Laid-Open No. 2005-158571, because at a gap caused in a concave portion of the uneven mask, the substrate and the mask cannot be brought into close contact with each other. Therefore, the insertion occurs at the time of vapor deposition.

A method of using a mask made of a magnetic material and bring the mask and the substrate into close contact with each other by a magnetic force is widely employed as a method for obtaining the close contact between the substrate and the mask. However, according to the studies made by the inventors of the present invention, when the mask and the substrate are brought into close contact with each other by using a magnet during a state in which the substrate and the mask which are aligned with each other in advance are in contact with each other, a phenomenon occurs in which the substrate and the mask are rubbed against each other to damage the mask and the substrate. That is, when the substrate and the mask are brought into close contact with each other by using the magnet, a method of suppressing a position displacement between the mask and the substrate at the time of close contact by the magnet is required.

DISCLOSURE OF THE INVENTION

The present invention has been accomplished in view of the above-mentioned problems in order to suppress a position displacement between a substrate and a mask during a vapor deposition step. Therefore, an object of the present invention is to provide a process for producing an organic light-emitting display device, which is capable of efficiently producing a display panel having high definition and a large size.

The present invention provides a process for producing an organic light-emitting display device having at least one organic compound layer on an electrode provided on a substrate, including the steps of:

aligning the substrate with a mask by an alignment mechanism;

pressing the aligned substrate against the mask by a pressing member to temporarily fix the substrate to the mask;

closely fixing the substrate and the mask which are temporarily fixed by the pressing member by a magnetization unit; and forming an organic compound layer on the substrate through the closely fixed mask by vapor deposition.

According to the present invention, the substrate and the mask are temporarily fixed by a pressing force of the pressing member after the alignment therebetween and then brought into close contact with each other by a magnetic force with keeping the temporarily fixed state. Therefore, a position displacement between the substrate and the mask does not occur. As a result, high-definition patterning can be performed even on a large-size substrate.

Further features of the present invention will become apparent from the following description of exemplary embodiments with reference to the attached drawings.

BRIEF DESCRIPTION OF THE DRAWINGS

FIG. 8 is a schematic diagram illustrating a patterning vapor deposition step for an organic EL display by vacuum vapor deposition.

BEST MODE FOR CARRYING OUT THE INVENTION

Figure 1:
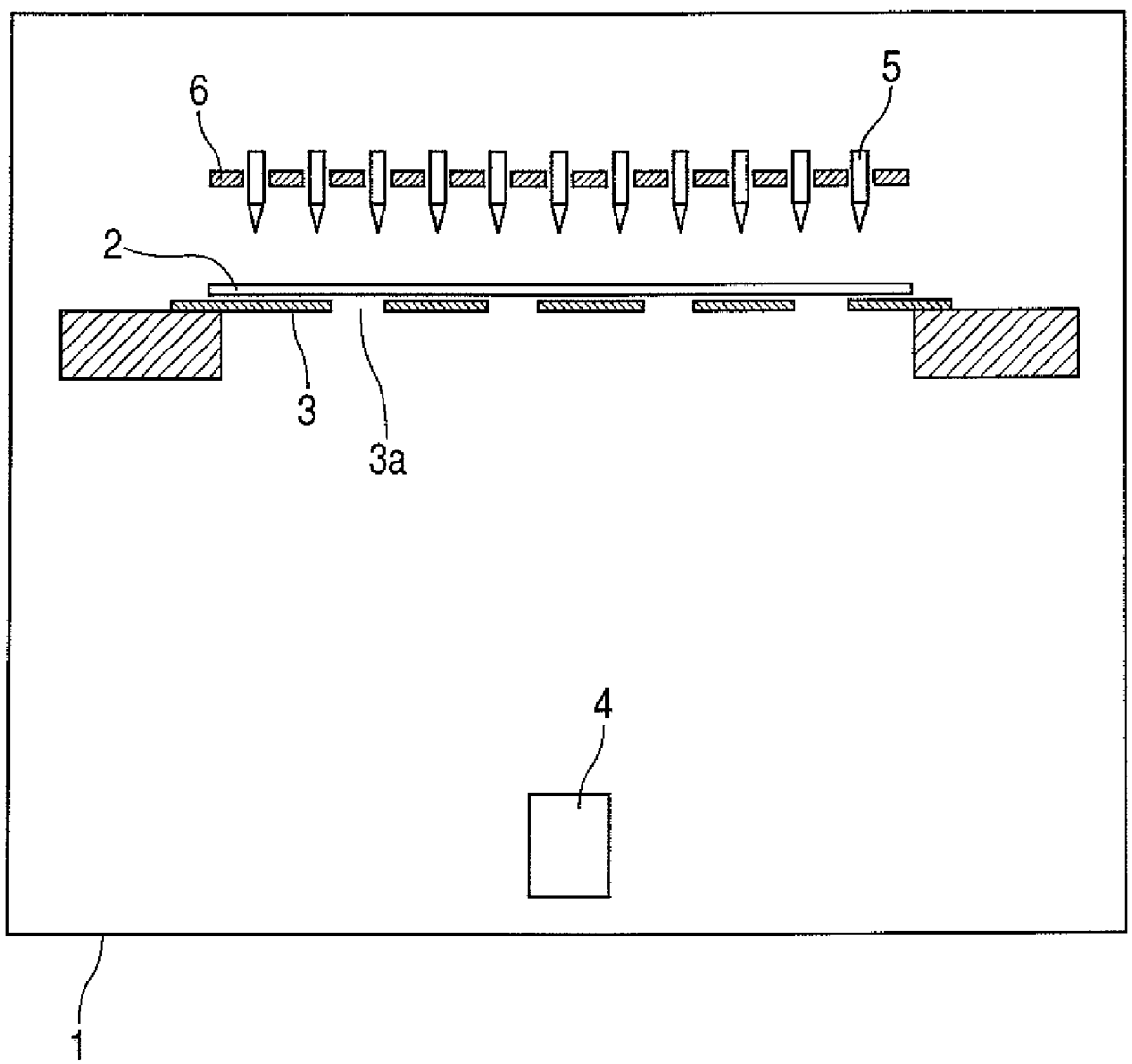
FIG. 1 is a schematic diagram illustrating an apparatus for producing an organic light-emitting display device according to Example 1.

An exemplary embodiment for embodying the present invention will be described with reference to the attached drawings.

A vacuum chamber 1 includes a substrate 2, a mask 3, a vapor deposition source 4, pressing members 5, and magnets 6.

As illustrated in FIG. 1, the substrate 2, the mask 3, and holding mechanisms therefor are provided in the vacuum chamber 1. The vacuum chamber 1 is maintained at the degree of vacuum which is, for example, $1\times10^{-3}$ Pa or less. The vapor deposition source 4 provided in the vacuum chamber 1 is located below the substrate 2. The substrate 2 and the vapor deposition source 4 may be fixed in position or moved relative to each other. A chamber used to bring the substrate 2 and the mask 3 into close contact with each other may be separated from the vacuum chamber 1 for vapor deposition but these chambers may be connected with each other in a vacuum state.

The mask 3 includes opening portions 3a, and a shape thereof has a thin plate shape. In order to realize a finer pattern, a plate thickness of a mask portion is 100 μm or less, more preferably 50 μm or less. A magnetic material, for example, a Ni—Co alloy is suitably used as a mask material. The openings are formed by etching or electroforming.

Further, a mask for a large-size substrate has a large area, so that it is difficult to realize precision in opening size. Therefore, a mask having a structure is suitably used in which a high-stiffness frame portion (mask frame) made of Invar is provided and a thin film mask is formed in a region surrounded by the frame.

For any purpose, a silicon substrate, a glass substrate, or a plastic substrate can be used as the substrate 2. A substrate in which driver circuits and pixel electrodes are formed in advance on a non-alkali glass can be used for a display. Alignment marks for alignment with the mask 3 are provided on the substrate 2.

Figure 7:
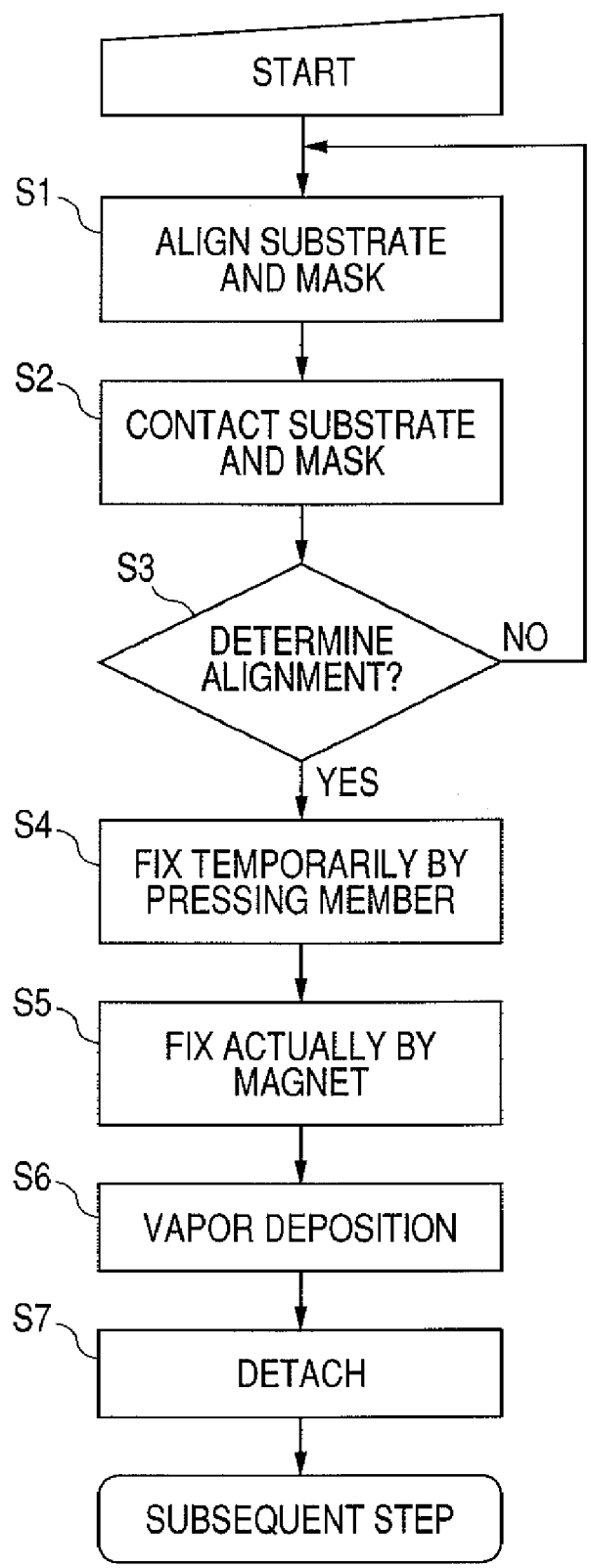
FIG. 7 is a flowchart illustrating the steps for producing the organic light-emitting display device according to Example 1.

Hereinafter, a process from a step of performing vapor deposition with a state in which the substrate 2 is in close contact with the mask 3 to a step of detaching the mask 3 will be described with reference to a flowchart of FIG. 7.

In Step S1, the substrate 2 and the mask 3 are aligned with each other. As illustrated in FIG. 1, the mask 3 is maintained at flat hold state. While the mask 3 and the substrate 2 are close to each other, the openings of the mask 3 are aligned with pixels on the substrate 2. At this time, it is desirable to maintain the substrate 2 and the mask 3 at an interval of approximately 100 μm to 500 μm. The alignment is performed by adjusting a position relationship between the alignment marks formed on the substrate 2 and the mask 3 by an alignment mechanism which is not shown.

In Step S2, the substrate 2 is brought into contact with the mask 3. In Step S3, alignment determination is performed. After the completion of the alignment, the substrate 2 is brought into contact with an upper portion of the mask 3. At this time, the substrate 2 is released from the alignment mechanism and thus located on the mask 3 by an own weight thereof. When it is determined that a position displacement between the substrate 2 and the mask 3 is a reference value or more, a state between the substrate 2 and the mask 3 is returned to a close state again and the above steps are repeated.

Figure 2:
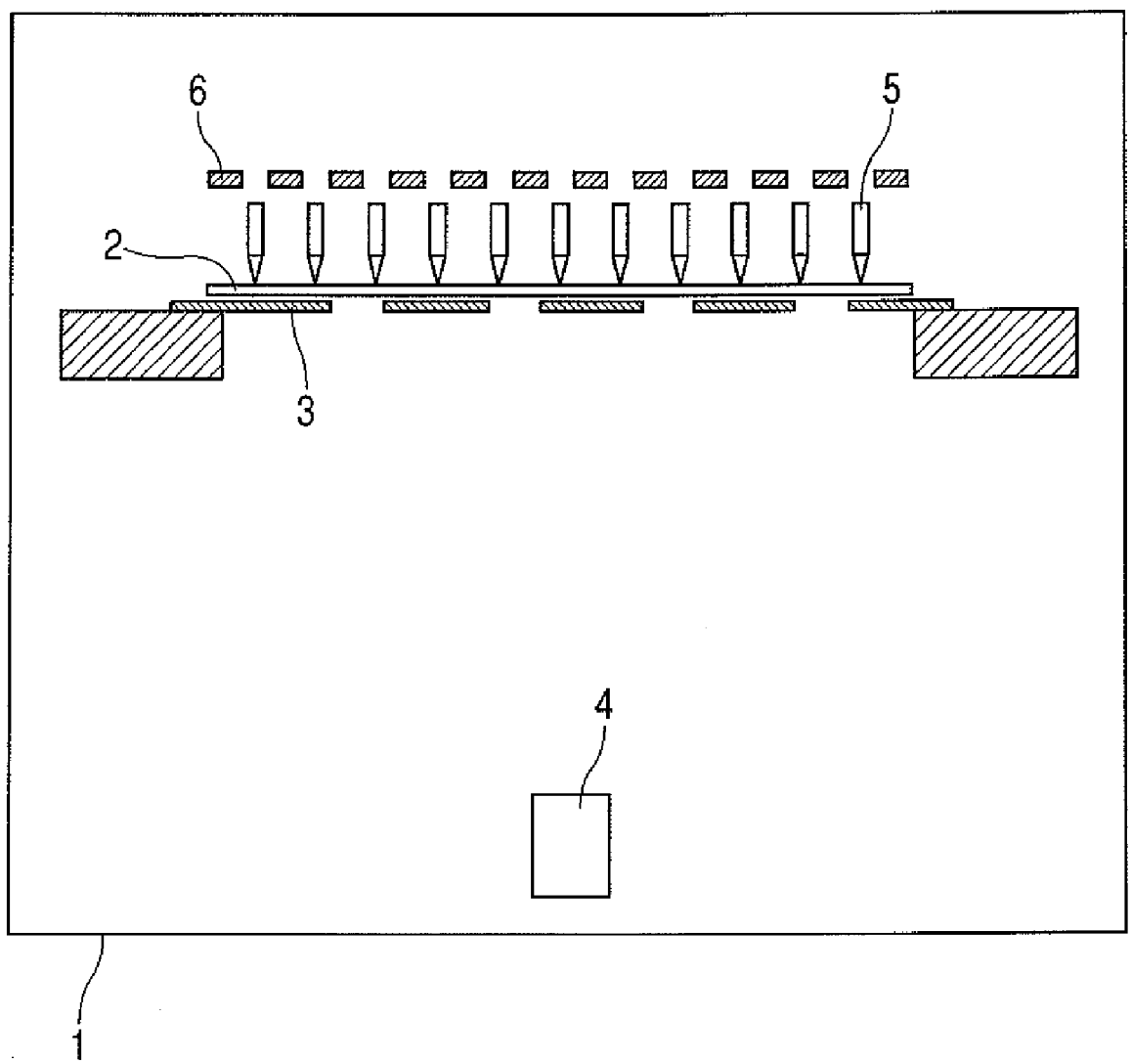
FIG. 2 is a schematic diagram illustrating a step for producing the organic light-emitting display device according to Example 1.

In Step S4, the substrate 2 and the mask 3 are temporarily fixed by the pressing members 5. As illustrated in FIG. 2, the pressing members 5 moves down from an opposite side of the mask 3 to press the substrate 2 against the mask 3, thereby performing temporary fixation. At this time, the number of pressing members 5 can be selected suitably based on the size of the substrate 2 and the alignment precision. Positions in which the substrate 2 is pressed can be selected suitably so as not to cause a displacement between the substrate 2 and the mask 3. It is more desirable to suitably select the pressing positions and a pressing strength based on the strength of the mask 3 and the alignment precision.

Timings at which the substrate 2 is pressed by the pressing members 5 may be the same time with respect to all the pressing members 5. In order to suppress the position displacement between the substrate 2 and the mask 3, it is more desirable to press the substrate 2 from a center position toward a peripheral position.

By performing the step for the temporary fixation, with keeping a state in which the substrate 2 and the mask 3 are pressed by the pressing members 5 is held, it is possible to suppress the position displacement caused when the mask 2 and the substrate 3 are brought into close contact with each other by a magnetic force.

Figure 3:
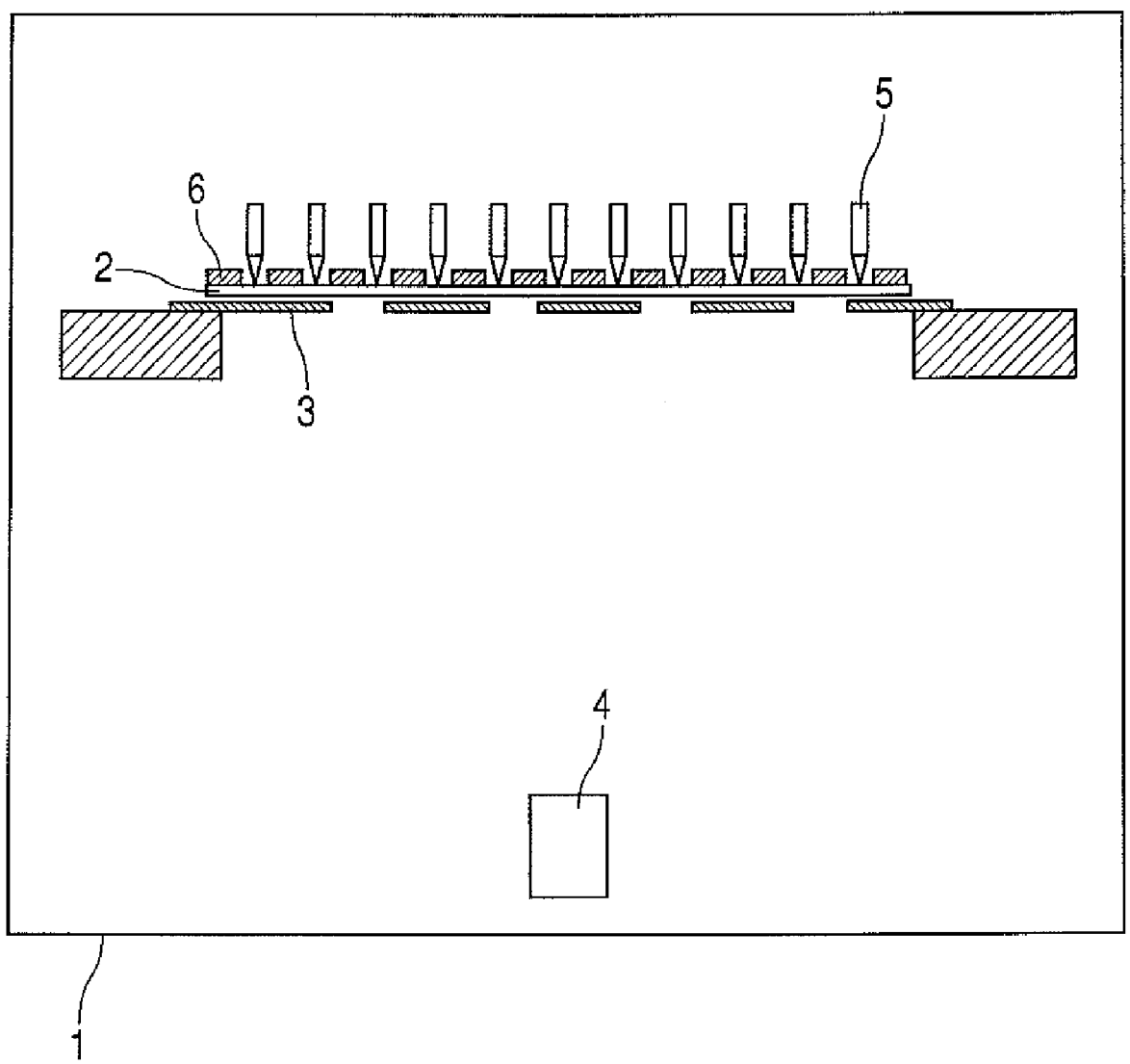
FIG. 3 is a schematic diagram illustrating another step for producing the organic light-emitting display device according to Example 1.

In Step S5, the substrate 2 and the mask 3 are actually fixed by the magnets 6 serving as a magnetization unit. FIG. 3 illustrates a state in which the magnets 6 are moved down to bring the substrate 2 and the mask 3 into close contact with each other while the substrate 2 and the mask 3 are pressed. A permanent magnet or an electromagnet can be used as each of the magnets 6. In order to suppress the influence of heat radiation from the vapor deposition source 4, the magnets 6 can be provided with a mechanism for cooling the substrate 2. With respect to the positions in which the substrate 2 is brought into contact with the magnets 6, it is particularly desirable to cover the opening regions of the mask 3.

In Step S6, vapor deposition is performed. While the substrate 2 and the mask 3 are brought into close contact with each other by the magnetic force, an organic compound material is vapor-deposited from the vapor deposition source 4. At this time, the substrate 2 may be continuously pressed by the pressing members 5. Alternatively, the pressing members 5 may be separated from the substrate 2 and thus only the magnetic force acts thereon.

In Step S7, detaching is performed. After the completion of the vapor deposition step, even when the magnets 6 are moved up in order to release the close contact state between the substrate 2 and the mask 3, it is likely to rub the substrate 2 and the mask 3 against each other by the position displacement therebetween. Therefore, it is effective in moving the magnets 6 up while the substrate 2 is pressed by the pressing members 5.

In this embodiment, the size of the substrate is not particularly limited. However, when a large-size substrate having a side length of 300 mm or more is particularly used, it is particularly effective in obtaining the close contact state with the mask from an alignment result. When an arrangement, shapes, a pressing strength of the pressing members are optimized based on the size of the substrate and the shape thereof, the position displacement between the substrate and the mask can be significantly suppressed at each of the temporary fixation and the actual fixation.

Example 1

Figure 4:
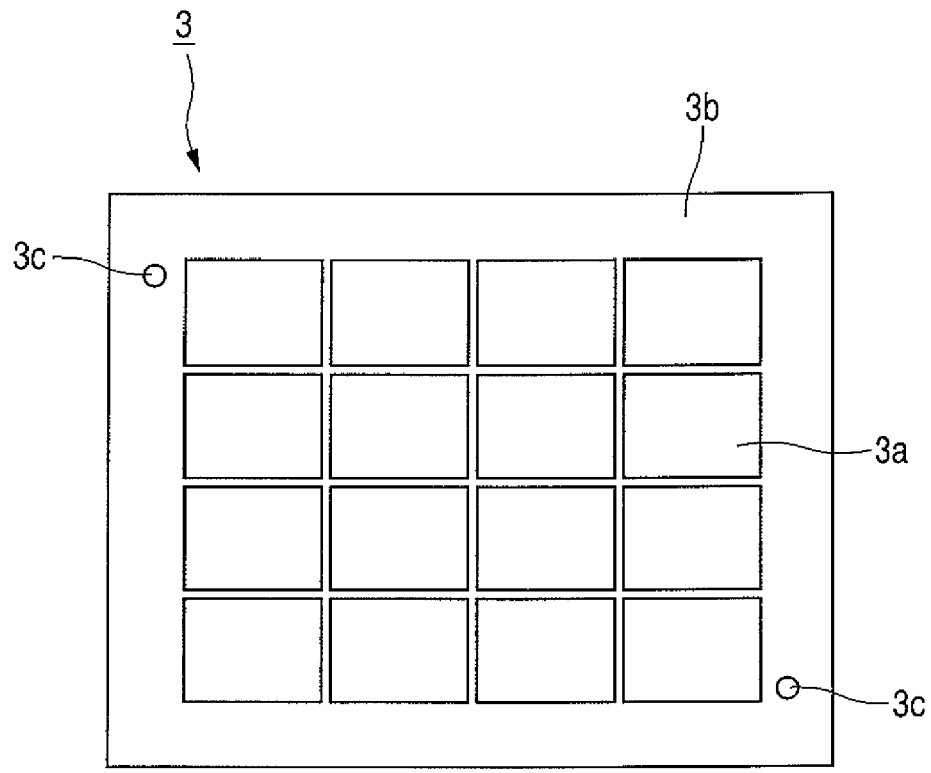
FIG. 4 is a schematic diagram illustrating a mask used in the apparatus of FIG. 1.

The mask 3 of 200 mm×250 mm square as shown in FIG. 4 was prepared by electroforming. The organic compound layer of the organic light-emitting display device was formed by the apparatus shown in FIGS. 1 to 3. The mask 3 had a structure made of a thin film for forming the opening portions 3a and a mask frame 3b for increasing the strength. The mask frame 3b was made of Invar and the thin film was made of a Ni—Co alloy material. A thickness of the mask frame 3b was set to 1 mm and a thickness of the thin film for the opening portions 3a was set to 12 μm. For the thin film, 16 surface regions each serving as the 30 mm×40 mm opening portion 3a were arranged. In each of the regions, an opening pattern of 40 μm×120 μm in size was repeatedly provided to make delta arrangement. An aperture ratio of the mask 3 was set to 1/3. Two alignment marks 3c were provided at diagonal positions. The mask 3 having a peripheral portion of 25 mm serving as a support region was located in the vacuum chamber 1.

A non-alkali glass having a size of 150 mm×200 mm and a thickness of 0.7 mm was used as the substrate 2. Patterned Cr anodes and the two alignment marks were provided during an etching step. A shape size of each of the Cr anodes was set to 20 μm×100 μm. The substrate 2 was introduced into the vacuum chamber 1 having the alignment mechanism and then the vacuum chamber 1 was evacuated.

Figure 5:
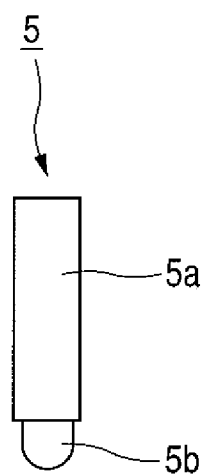
FIG. 5 is a schematic diagram illustrating a pressing member used in the apparatus of FIG. 1.

Each of the pressing members 5 to be used was a structure as shown in FIG. 5 and could be pressed by a spring mechanism. With respect to each of the pressing members 5, a rod 5a having a diameter of 6 mm and cut from SUS303, and a molded part made of polytetrafluoroethylene was attached to a tip portion 5b to be in contact with the substrate. The tip portion 5b was designed to have a spherical shape.

Figure 6:
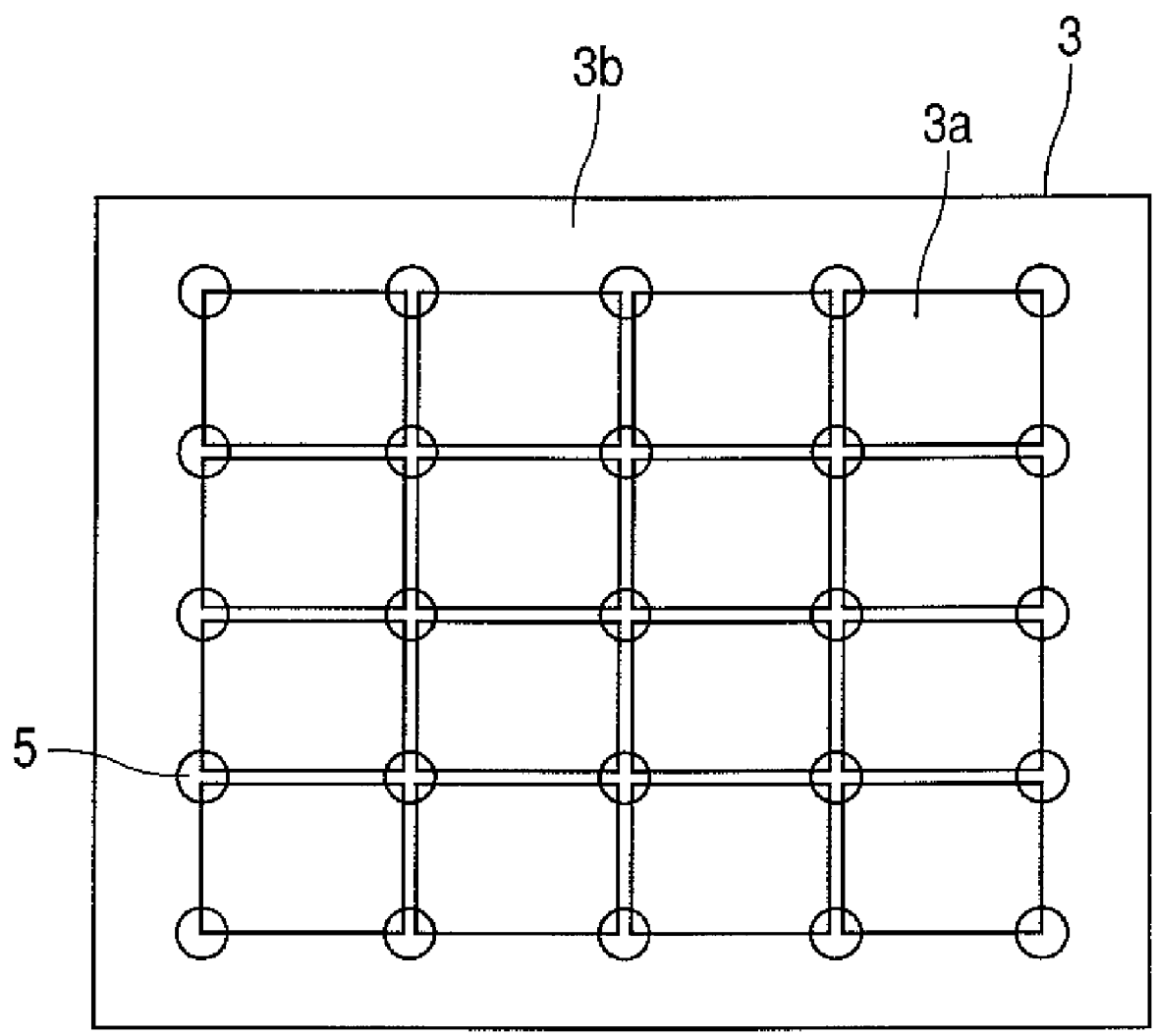
FIG. 6 is a schematic diagram illustrating an arrangement of pressing members in the apparatus of FIG. 1.

As shown in FIG. 6, the pressing members 5 were arranged such that the intersection points and the vicinities of the end portions in the mask frame 3b of the mask 3 could be pressed from the substrate side at 25 positions. The positions of the pressing members 5 were adjusted such that the substrate was pressed substantially simultaneously by the pressing members 5 located in the 25 positions.

With respect to the magnets 6, permanent magnets each having a size of 24 mm×36 mm and a thickness of 5 mm were arranged at 16 positions corresponding to the opening portions 3a of the mask 3 so as not to interfere with the pressing members 5.

With a vacuum state, the alignment mechanism was operated to shorten a distance between the substrate 2 and the mask 3 to 100 μm. Then, while the alignment marks (not shown) provided on the substrate 2 and the alignment marks 3c provided on the mask 3 were monitored by a CCD camera, the substrate was moved by the alignment mechanism, thereby performing the alignment. After the alignment mechanism was operated to bring the substrate 2 into contact with the mask 3, the pressing members 5 were moved down to press the substrate 2 against the mask 3 by the pressing members 5.

Then, all the magnets 6 were substantially simultaneously brought into contact with the substrate 2 to make the absorption between the substrate 2 and the mask 3. While the magnets 6, the substrate 2 and the mask 3 were integrated with one another, Alq3 (produced by Dojindo Laboratories) expressed by the following chemical formula was vapor-deposited a thickness of 700 angstroms under a condition of the degree of vacuum of $2\times10^{-4}$ Pa at a vapor deposition rate of 3 angstroms per second by a vacuum vapor deposition method. After film formation, a shape of an Alq3 thin film which was the organic compound layer on the substrate 2 was examined. As a result, a size of the shape was substantially the same as an opening size of the mask 3 and thus no insertion of the film was observed. The Alq3 thin film was adequately located on the Cr anodes.

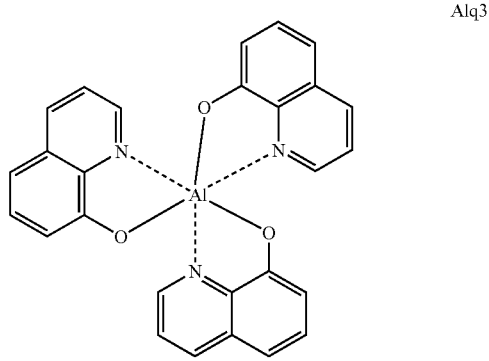

Alq3

Example 2

The mask was produced by the same method as in Example 1 and placed in the vacuum chamber. The substrate was produced by the same method and introduced into the vacuum chamber. As in Example 1, the pressing members were arranged such that the intersection points and the vicinities of the end portions in the mask frame of the mask were pressed at 25 positions. At this time, the set positions of the pressing members located in the 25 position were adjusted such that the pressing members were pressed in order from the center portion of the substrate to the end portion of the substrate. The spring mechanism was adjusted such that a pressing force applied to the center of the substrate became equal to a pressing force applied to the periphery of the substrate in plane.

With respect to the magnets which were the same as in Example 1 were arranged at 16 positions corresponding to the opening portions of the mask so as not to interfere with the pressing members as in Example 1.

With a vacuum state, the alignment was performed as in Example 1. The alignment mechanism was operated to bring the substrate into contact with the upper portion of the mask. After that, the pressing members were moved down to press the substrate against the mask by the pressing members.

Then, all the magnets were substantially simultaneously brought into contact with the substrate to make the absorption between the substrate and the mask. While the substrate and the mask are integrated with one another, Alq3 (produced by Dojindo Laboratories) was vapor-deposited in a thickness of 700 angstroms under a condition of the vacuum degree of $2\times10^{-4}$ Pa at a vapor deposition rate of 3 angstroms per second by a vacuum vapor deposition method. After film formation, a shape of an Alq3 thin film on the substrate was examined. As a result, a size of the shape was substantially the same as an opening size of the mask and thus no insertion of the film was observed. The Alq3 thin film was adequately located on the Cr anodes.

Example 3

The mask was produced by the same method as Example 1 and placed in the vacuum chamber. The substrate was also produced by the same method and introduced into the vacuum chamber.

As in Example 1, the pressing members were arranged such that the intersection points and the vicinities of the end portions in the mask frame were pressed at 25 positions. At this time, the set positions of the pressing members located in the 25 positions were adjusted such that the pressing members were pressed in order from the center portion of the substrate to the end portion of the substrate. The spring mechanism was adjusted such that the pressing force applied to the center of the substrate became equal to the pressing force applied to the periphery of the substrate in plane.

With respect to the magnets, permanent magnets each having a size of 4 mm×36 mm and a thickness of 20 mm were arranged at 16 positions corresponding to the opening portions of the mask so as not to interfere with the pressing members. A water-cooled tube was provided inside the magnets to construct a mechanism for allowing cooled water to pass through the water-cooled tube, thereby cooling the substrate.

With a vacuum state, the alignment was performed as in Example 1. The alignment mechanism was operated to bring the substrate into contact with the upper portion of the mask. After that, the pressing members were moved down to press the substrate against the mask by the pressing members.

Then, all the magnets were substantially simultaneously brought into contact with the substrate to make the absorption between the substrate and the mask. While the magnets, the substrate and the mask were integrated with one another, Alq3 (produced by Dojindo Laboratories) was vapor-deposited under a condition of the vacuum degree of $2\times10^{-4}$ Pa by a vacuum vapor deposition method. At this time, the vapor deposition rate was 6 angstroms per second and the vapor-deposited film thickness was 3000 angstroms. In this example, a film formation condition in which the amount of heat radiation from the vapor deposition source was larger than that in Example 2 was set. After film formation, a shape of an Alq3 thin film on the substrate was examined. As a result, a size of the shape was substantially the same as an opening size of the mask and thus no insertion of the film was observed. The Alq3 thin film was adequately located on the Cr anodes.

Comparative Example

The mask was produced by the same method as in Example 1 and placed in the vacuum chamber. The substrate was also produced by the same method and introduced into the vacuum chamber. The pressing members were not provided. The magnets were arranged as in Example 1. With a vacuum state, the alignment was performed as in Example 1. The alignment mechanism was operated to bring the substrate into contact with the upper portion of the mask.

Then, all the magnets were substantially simultaneously brought into contact with the substrate to make the absorption between the substrate and the mask. While the magnets, the substrate and the mask were integrated with one another, Alq3 (produced by Dojindo Laboratories) was vapor-deposited in a thickness of 700 angstroms under a condition of the vacuum degree of $2\times10^{-4}$ Pa at a vapor deposition rate of 3 angstroms per second by a vacuum vapor deposition method. After film formation, a shape of an Alq3 thin film on the substrate was examined. As a result, a size of the shape was substantially the same as an opening size of the mask and thus no insertion of the film was observed. However, the Alq3 thin film was deviated from the upper portions of the Cr anodes and thus not adequately located.

This application claims the benefit of Japanese Patent Application No. 2006-231472, filed Aug. 29, 2006, which is hereby incorporated by reference herein in its entirety.

The invention claimed is:

1. A process for producing an organic light-emitting display device having at least one organic compound layer on an electrode provided on a substrate, comprising the steps of:
   aligning the substrate with a mask by an alignment mechanism;
   pressing the aligned substrate against the mask from a central part toward a periphery of the substrate by a pressing member to temporarily fix the substrate to the mask;
   closely fixing the substrate and the mask which are temporarily fixed by the pressing member by a magnetization unit; and
   forming an organic compound layer on the substrate through the closely fixed mask by vapor deposition,
   wherein the substrate is temporarily fixed to the mask at a plurality of positions by a plurality of pressing members, respectively, and
   wherein when the substrate is temporarily fixed to the mask, pressing times or pressing strengths of the plurality of pressing members are different on a surface of the substrate.

2. An apparatus for producing an organic light-emitting display device having at least one organic compound layer on an electrode provided on a substrate, comprising:
   an alignment mechanism for aligning the substrate with a mask;
   a plurality of pressing members for pressing a plurality of positions of the substrate against the mask from a central part toward a periphery of the substrate to temporarily fix the substrate to the mask;
   a magnetization unit for closely fixing the substrate to the mask by a magnetic force; and
   a vapor deposition source for forming the organic compound layer on the substrate through the mask by vapor deposition,
   wherein the magnetization unit comprises a mechanism for cooling the substrate.

3. A process for producing an organic light-emitting display device having at least one organic compound layer on an electrode provided on a substrate, comprising the steps of:
   aligning the substrate with a mask by an alignment mechanism;
   pressing the aligned substrate against the mask from a central part toward a periphery of the substrate by a pressing member to temporarily fix the substrate to the mask; and
   forming an organic compound layer on the substrate through the fixed mask by vapor deposition,
   wherein the substrate is temporarily fixed to the mask at a plurality of positions by a plurality of pressing members, respectively, and wherein when the substrate is temporarily fixed to the mask, pressing times or pressing strengths of the plurality of pressing members are different on a surface of the substrate.

* * * * *